United States Patent

Haefling et al.

[15] 3,666,913

[45] May 30, 1972

[54] METHOD OF BONDING A COMPONENT LEAD TO A COPPER ETCHED CIRCUIT BOARD LEAD

[72] Inventors: James F. Haefling, Richardson; Lawrence L. Meyer, Houston, both of Tex.

[73] Assignee: Texas Instruments Incorporated, Dallas, Tex.

[22] Filed: Sept. 14, 1966

[21] Appl. No.: 579,409

[52] U.S. Cl. .................................219/118, 29/628, 117/93, 117/212

[51] Int. Cl. .................................B23k 11/20

[58] Field of Search .................................29/589, 590, 591, 628; 117/212, 93, 231; 219/118

[56] References Cited

UNITED STATES PATENTS 3,190,771 6/1965 McLean et al. .................................117/93

FOREIGN PATENTS OR APPLICATIONS 74,967 3/1945 Czechoslovakia .................................29/589

814,527 6/1959 Great Britain .................................29/590

*Primary Examiner*—Alfred L. Leavitt

*Assistant Examiner*—J. R. Batten, Jr.

*Attorney*—Samuel M. Mims, Jr., James O. Dixon, Andrew M. Hassell, John E. Vandigriff and Rene' E. Grossman

[57] ABSTRACT

This invention provides a method for bonding a copper etched circuit board lead to a component lead while eliminating blow out of the copper lead by applying an oxide to the copper lead which is relatively non-conductive at temperatures below the welding temperature but decomposible at the welding temperature. Because of the insulating properties of the oxide, a larger current passes through the component lead than the copper lead, allowing the component lead to be preheated to the bonding temperature, decomposing the oxide and thereby bonding the copper lead to the preheated component lead.

1 Claim, 4 Drawing Figures

INVENTOR
James F. Haefling
Lawrence L. Meyer
BY James O. Dixon
ATTORNEY

METHOD OF BONDING A COMPONENT LEAD TO A COPPER ETCHED CIRCUIT BOARD LEAD

This invention relates to a coating material for etched circuit boards, and more particularly to a method of bonding component leads to copper etched circuit board leads involving the application of a copper oxide film to the etched circuit board leads.

In the parallel gap welding technique which is widely used in attaching circuit component leads to copper leads of etched circuit boards, a component lead is placed on the copper lead of a board to which the component lead is to welded. The two electrodes of the parallel gap welder are then placed upon the component lead, and a voltage is applied across the two electrodes which causes separate currents to flow in the component lead and in the copper lead of the etched circuit board. The effect of these currents is to create $I^2R$ heating in the leads which causes their temperature to rise to a level at which they become permanently bonded.

Commonly, component leads are made of an alloy of gold or of an iron-nickel-cobalt glass-sealing metal alloy coated with gold. Such metal alloy is sold under the trademark "-Kovar" by Westinghouse Electric Corporation. However, the resistivity of the copper leads is much lower than the resistivity of the component leads. Consequently, during the act of welding, this resistivity difference in the two leads causes a greater current to flow in the copper lead than in the component lead, with the result that the copper lead may become overheated and "blow out," like a fuse, before the component lead heats to a sufficient degree to effect a bond between the two leads.

It is, therefore, an object of this invention to provide an etched circuit board lead which permits conventional welding techniques to be used in welding a component lead to a board lead which avoids the possibility of a "blow out" of said board lead.

Figures 1, 2, 3:
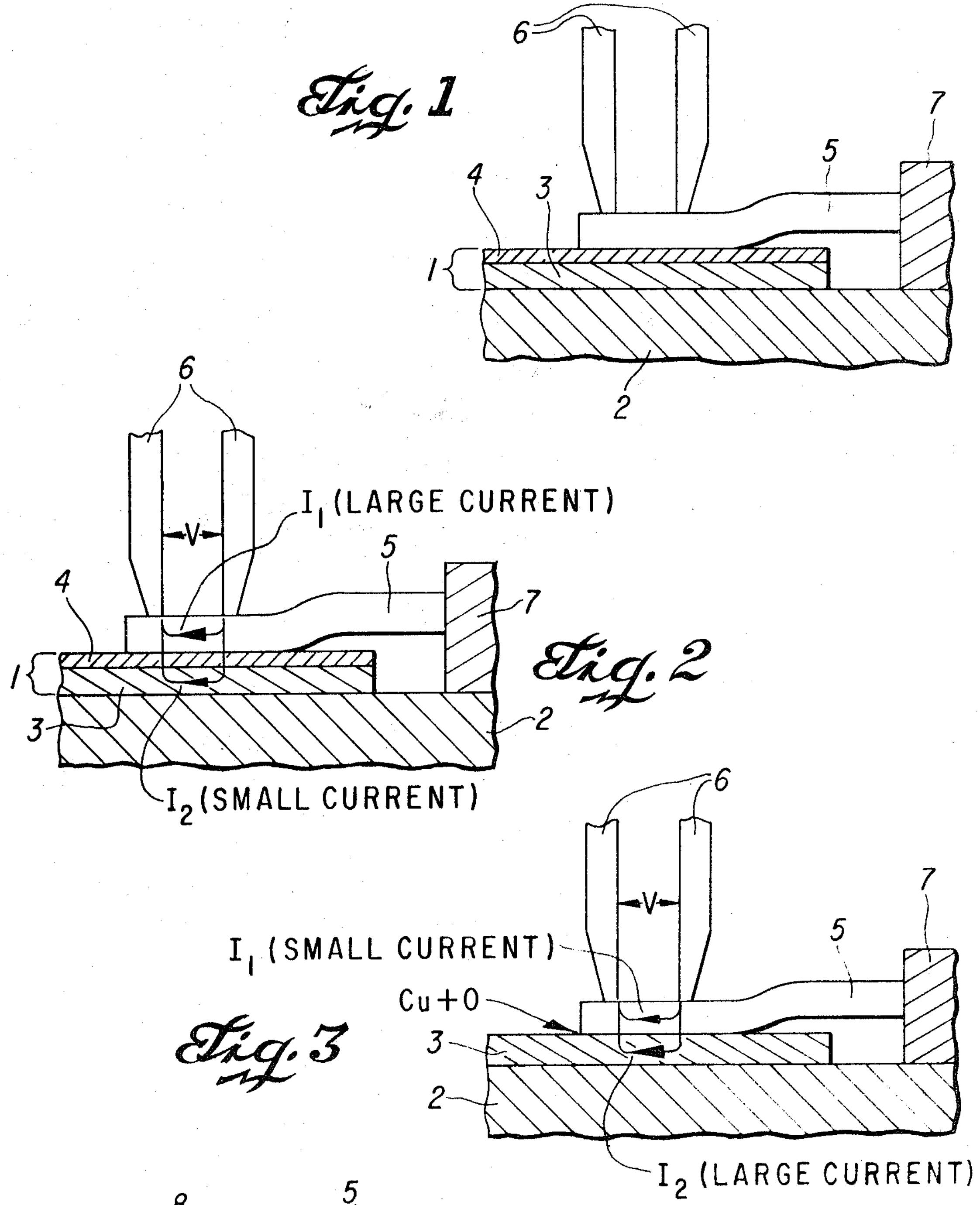
Figure 4:
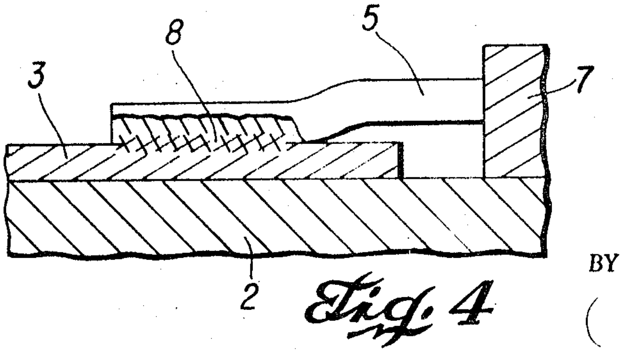

Various other objects, features and advantages of the invention will become apparent from the following description, appended claims and the attached drawing, in which FIG. 1 is an elevational view in section of a circuit board and lead embodying the invention, together with a showing of the parallel gap electrodes positioned for the performance of the welding process, and FIGS. 2, 3, and 4 diagramatically depict the physical events occurring at different stages of the gap welding processes utilizing the present invention.

In brief, the invention involves the use of a film of an oxide of copper (either cuprous-oxide, $Cu_2O$, or cupric oxide, $CuO$) upon the welding surface of the copper lead. This film may be applied by chemical techniques which provide for a uniform and controlled thickness. The film of copper oxide, which is relatively non-conductive at temperatures below the welding temperature but decomposable at the welding temperature, serves to electrically insulate the copper lead on the etched circuit board from the component lead. Initially, the component lead will be heated by the welding current, and after the copper oxide film has decomposed at the welding temperature, the copper lead on the etched circuit board will be heated both electrically and by conduction from the heated component lead. This permits an alloy bond to be formed between the two leads without copper "blow out."

Referring now to the drawing, FIG. 1 shows a copper etched circuit board lead 3 with a copper oxide film 4 thereon. Lead 3 is a strip conductor which is affixed to the surface of an insulating base 2 of the type commonly used in etched circuit boards, for example, epoxy impregnated fiber glass. A lead or tab 5, of a circuit component 7, perhaps an integrated circuit package, rests firmly upon the copper oxide surface of copper lead 1 to which component lead 5 is to be welded. The electrodes 6 of a parallel gap welder, many types of which are commercially available, are shown in position to begin the welding operation. The electrodes are, of course, connected to a source of welding power and an automatic timing device (not shown). This timing device controls the application of the power at the beginning of the welding cycle and shuts if off when the copper lead and component lead are welded at the end of the welding cycle.

The physical events involved at various stages during the gap-welding operation are represented in FIGS. 2, 3, and 4. In FIG. 2, the two electrodes 6 of the parallel gap welder are shown in position on the component lead 5. The voltage V is impressed upon these electrodes, causing currents $I_1$ and $I_2$ to flow in the leads 5 and 3, respectively. Because of the insulating properties of the copper oxide film 4, $I_1$ is much greater than $I_2$, resulting in the component lead 5 being heated faster then the copper lead 3. When the component lead reaches the welding temperature, the copper oxide film decomposes into copper and oxygen, thereby destroying its insulating properties and allowing a greater current to flow in the copper lead. As shown in FIG. 3, $I_2$ flowing through the copper lead is larger than $I_1$ flowing through the component lead. Then, as the copper melts at the contact surface, it bonds with the preheated component lead, as shown in FIG. 4, the bond being indicated by the numeral 8, and the current is shut off. It can be seen, therefore, that the copper oxide film controls the quantity of current which flows in the copper lead of the etched circuit board, thereby preventing "blow out, " and optimumizing welding conditions.

The use of a copper oxide film or surface offers collateral advantages in addition to creating optimum welding conditions. The film provides a protective coating for the copper leads, thus preventing corrosion during extended periods of storage; it also eliminates the possibility of contaminating the copper leads by decomposition products when using other types of "blow out" retarding compounds, such as plastics, since on the thermal decomposition of the copper oxide film only copper and oxygen are present.

While the invention has been described with reference to an illustrative embodiment, it is understood that this description is not to be construed in a limiting sense. Other embodiments of the inventive concept, as well as modifications of the disclosed embodiment, will appear to persons skilled in the art. It is thus contemplated that the appended claims will cover any such embodiments or modifications as fall within the true scope of the invention.

I claim:

1. A method of bonding a component lead of a first resistivity to a copper etched circuit board lead having a resistivity much lower than said first resistivity, wherein said copper etched lead has a surface thereof coated with an oxide of copper, comprising:
   a. contacting a longitudinal area of the oxide coated surface of the copper etched lead with said component lead; and
   b. contacting two spaced apart points of said component lead with terminals having a voltage potential maintained therebetween to cause a first current to flow through a region of said component lead and a second current to flow through a region of said copper etched lead, said first current initially being larger than said second current as a result of the insulative effect of said oxide, thereby
      1. initially heating said component lead to a higher temperature than the temperature of said copper etched lead, said higher temperature being sufficient to reduce said oxide,
      2. reducing said oxide, and
      3. causing said second current to become larger than said first current, thereby raising the temperature of said copper etched lead and effecting a bond between said component lead and said copper etched lead.

* * * * *